United States Patent [19]

Nomura et al.

[11] 4,131,466
[45] Dec. 26, 1978

[54] PHOTOGRAPHIC METHOD OF MAKING RELIEF MEMBER WITH NEGATIVE DYE IMAGE

[75] Inventors: Masahiro Nomura, Kasukabe; Yutaka Hirabayashi, Tokyo, both of Japan

[73] Assignee: Somar Manufacturing Co., Ltd., Tokyo, Japan

[21] Appl. No.: 638,362

[22] Filed: Dec. 8, 1975

Related U.S. Application Data

[63] Continuation-in-part of Ser. No. 336,322, Feb. 27, 1973, abandoned.

[30] Foreign Application Priority Data

Mar. 5, 1972 [JP] Japan .................................. 47/22564

[51] Int. Cl.² .................... G03C 5/34; G03C 5/24; G03F 1/00
[52] U.S. Cl. ...................................... 96/49; 96/91 R; 96/33; 96/36; 96/75
[58] Field of Search ...................... 96/91 R, 75, 49, 33, 96/36, 35.1, 36.3

[56] References Cited

U.S. PATENT DOCUMENTS

| | | | |
|---|---|---|---|
| 2,687,958 | 8/1954 | Neugebauer | 96/91 N |
| 2,937,085 | 5/1960 | Seven et al. | 96/75 |
| 3,091,529 | 11/1961 | Buskes | 96/75 |
| 3,407,065 | 10/1968 | Chalkley | 96/33 |
| 3,598,585 | 8/1971 | Gaspar | 96/36 |
| 3,679,419 | 7/1972 | Gillich | 96/75 |
| 3,704,125 | 11/1972 | Ketley et al. | 96/14 |
| 3,721,557 | 3/1973 | Inoue | 96/91 D |
| 3,756,818 | 9/1973 | Hayakawa et al. | 96/35.1 |
| 3,829,315 | 8/1974 | Schadlich et al. | 96/33 |
| 3,844,787 | 10/1974 | Ulrich et al. | 96/91 N |

*Primary Examiner*—Charles L. Bowers, Jr.
*Attorney, Agent, or Firm*—Gerald J. Ferguson, Jr.; Joseph J. Baker

[57] ABSTRACT

A lithographic photographic material has a photosensitive layer comprising gelatin having an isoelectric point of at least 7 and a condensation product formed between a diazonium salt of a para-aminodipheynylamine derivative and an aldehyde. The photosensitive layer can be photoinsolubilized and will form a photo-relief.

A method for using the lithographic photographic material comprises partially photoinsolubilizing the photosensitive layer and then immersing it in a bath of an acid or direct dye to form level dying, washing the dye material with water to remove unexposed areas, thereby forming an image composed of the dye photoinsolubilized resin layer corresponding to the exposed areas.

8 Claims, No Drawings

PHOTOGRAPHIC METHOD OF MAKING RELIEF MEMBER WITH NEGATIVE DYE IMAGE

REFERENCE TO RELATED APPLICATION

This application is a continuation-in-part of United States Patent Application Serial Number 336,322 filed Feb. 27, 1973, now abandoned.

BACKGROUND OF THE INVENTION

Field of the Invention

This invention relates to a novel lithographic photographic material comprising a transparent film and a photosensitive layer formed thereon, said photosensitive layer composed of gelatin having an isoelectric point (to be referred to as PI) of at least 7 and a condensation product formed between a diazonium salt of a para-aminodiphenylamine derivative and an aldehyde, and to a method for using said material by exposing said material, dyeing it with an acid or direct dye, and washing it with water thereby to produce a photograph of high contrast and density.

Discussion of the Prior Art

Conventional lithographic photographic materials attain photographic characteristics of high contrast and high density by treatment of a silver halide photographic material using an infectious developer. However, it is general common knowledge in the art of photo engraving that this developer, because of its composition, is especially susceptible to oxidation and is unstable, and therefore has a very short lifetime, thus having difficulty in giving uniform photographic characteristics. Furthermore, when pressure, impact force or frictional force is applied to a photographic material, a portion is desensitized or forms a developable latent image. In addition, non-uniformity occurs in finishing as a result of small changes in the temperature of the developer solution or in the stirring of the developer solution, and a high degree of skill is needed to handle such a photographic material. The constituent elements of the resulting image are particles, and their size and density vary as a result of development and fixation, which in turn brings about subtle changes in resolving power, density and contrast.

The present invention relates to a novel lithographic photographic material which has eliminated these defects, and to a method for using such material.

The photorelief method is a method whereby a resin composition whose solubility changes upon irradiation with light is formed on a support, and after exposure to actinic light unexposed areas are removed using a suitable remover according to the amount of exposure to thereby form a relief image on the support. This relief image itself is a transparent resin composition, and becomes a relief photograph if subjected to coloration and opacification. Previously, relief photographs were produced by (1) incorporating a coloring agent into the resin composition, or (2) coloring the relief after its formation.

According to method (1), a non-transparent coloring agent is introduced into the photosensitive layer and absorbs actinic light, therefore the effective sensitivity of the photographic material is reduced. It is impossible to increase the density, and this method can be applied only to special photographs. When a pigment is incorporated into the photosensitive layer the resolving power of the resulting photographic material is especially inferior and the material cannot be used for lithographic purposes.

In an attempt to remove such a defect, colorless coloring agents have been used, but after formation of a relief, color must be developed by reduction, oxidation or other means. This process is therefore complicated, and the same degree of skill as with a conventional lithographic photographic material is required for uniform finishing. Furthermore, the resulting material does not have a high resolving power and has a colored background and therefore cannot be utilized for lithographic purposes.

Method (2) described above is a method whereby a relief is first formed and then colored with a dye or pigment. However, the coloration density is not sufficiently high. If the density is increased, the background will be colored, and it is necessary, after coloration, to immerse the material in a surfactant bath or rub it with a sponge or the like, and the relief image may be dissolved out so that high density and high contrast cannot be attained. Furthermore, the resolving power of such a material is inferior and the storage life is short, which makes it useful only for special photographic purposes.

SUMMARY OF THE INVENTON

The inventors of the present invention have made meticulous investigations of the influence on solubility and the degree of swelling of the mutual effects of a photoinsolubilizer, a coloring agent and an insolubilizable resin. As a result, they have provided a novel lithographic photographic material having higher density and higher contrast than conventional lithographic photographic materials with an elimination of the defects of the prior art and have provided a simple method of using such an element.

According to the present invention, there is provided a novel lithographic photographic material comprising a transparent film and a photosensitive layer formed thereon having a photoinsolubilizing ability and capable of forming a photo relief layer comprising gelatin having an isoelectric point of at least 7 and a condensation product formed between a diazonium salt of a para-aminodiphenylamine derivative and an aldehyde.

There is also provided a method for using this lithographic photographic material which comprises partially photoinsolubilizing the material, immersing it in a bath of an acid or direct dye to perform level dyeing, washing the dyed material with water to dissolve and remove the unexposed areas of the resin layer together with the dye and forming an image composed of the dyed photoinsolubilized resin layer corresponding to the exposed area.

In the photographic material of this invention, non-solubility, non-swellability and good dyeability based on the mutual effects of the photoinsolubilizer, the insolubilized resin and the dye are required in exposed areas, and good solubility and rapid swellability based on the mutual effects of the non-photodecomposed photoinsolubilizer, the noninsolubilized resin and the dye are required in unexposed areas.

Surprisingly, it has been found that these conditions are all met only when a photorelief material comprising a combination of type A gelatin having an isoelectric point on the alkaline side and a condensation product formed between a diazonium salt of a para-aminodiphenylamine derivative and an aldehyde is exposed imagewise to actinic light, and immersed in an aqueous solution of an acid or direct dye.

DETAILED DESCRIPTION OF THE INVENTION

Some facts which became known in the course of reaching the present invention will be listed below with respect to gelatin used as a water-soluble resin that can be photoinsolubilized (Reference may be made to U.S. Patents 2,679,498, (1954) and 3,050,502 (1962) where the phenomenon of photoinsolubilization is explained in greater detail).

A dry film, 1 micron thick, of gelatin having an isoelectric point of 7.8 or 4.9 was formed on a polyethylene terephthalate film having a size of 5 × 8 cm. The resulting material was immersed for 5 minutes in each of the following baths (1) to (4) (kept at 20° C.).

(1) A 2.5% aqueous solution of a condensation product formed between para-diazodiphenylamine and formaldehyde.
(2) A 2.5% aqueous solution of an acid dye: Acid Fast Blue 4GL (C.I. 61125).
(3) A 2.5% aqueous solution of a direct dye: Direct Fast Red F (C.I. 22310).
(4) A 2.5% aqueous solution of a basic dye: Methylene Blue FZ (C.I. 52015).

The material was then washed with flowing tap water at 18° C. The solubility of each gelatin film at this time was as shown in Table 1.

Table 1

| Immersion solutions | 1 | 2 | 3 | 4 |
|---|---|---|---|---|
| Type A gelatin with PI of 7.8 | good* | good | good | slightly** poor |
| Type B gelatin with PI of 4.9 | poor*** | poor | poor | poor |

*easily dissolved
**required a long period for dissolution
***hardly dissolved

The diazonium condensation product was incorporated into each of the two gelatins (fresh gelatin) in an amount of 2.5% by weight based on the weight of the gelatin, and a 1 micron thick film of the mixture was prepared. The film was immersed for 1 minute at 40° C. in each of the dye solutions (2), (3) and (r), and then washed with flowing tap water at 18° C. for 30 seconds. The solubility of each gelatin film in water was as shown in Table 2.

Table 2

| Immersion solutions | 2 | 3 | 4 |
|---|---|---|---|
| Type A gelatin with PI of 7.8 + diazonium condensate | good water solubility | good water solubility | good water solubility |
| Type B gelatin with PI of 4.9 + diazonium condensate | poor water solubility | poor water solubility | poor water solubility |

Each of the undyed test samples prepared in connection with Table 2 was exposed to ultraviolet rays until the diazonium compounds completely decomposed as evidenced by a disappearance of the characteristic yellow color of the diazonium compounds, immersed in each of the dye solutions (2), (3) and (4) for 1 minute at 40° C., and then washed with water at 18° C. for 30 seconds. The dyeability and water solubility of unexposed areas of each film were shown as shown in Table 3.

Table 3

| Immersion solutions | 2 | 3 | 4 |
|---|---|---|---|
| Type A gelatin with PI of 7.8 + diazonium condensate | Sufficiently dyes | Sufficiently dyed | Not dyed |
| Irradiation | Not swelled nor dissolved | Not swelled nor dissolved | Not swelled nor dissolved |
| Type B gelatin with PI of 4.9 + diazonium condensate | Insufficiently dyed | Insufficiently dyed | Insufficiently dyed |
| Irradiation | Swelled and partly dissolved | Swelled and partly dissolved | Not swelled nor dissolved |

These results are only part of those obtained from experiments which were extensively performed, and generally equivalent results will be obtained when dye solution (2) is arbitrarily changed to another acid dye solution, dye solution (3) to another direct dye solution and dye solution (4) to another basic dye solution. Gelatins having an isoelectric point on the alkaline side are generally called Type A gelatins, and those having an isoelectric point on the acid side, Type B gelatins (these terms are defined in greater detail later).

Table 2 shows the structure of the unexposed area of the lithographic type photographic material of this invention and its processing step, and demonstrates that a mixture of type A gelatin with the diazonium compound is superior to the system containing type B gelatin in the rapid swellability and solubility of unexposed areas.

Table 3, on the other hand, shows the structure of the exposed area of the lithographic photographic material of this invention and its processing step, and demonstrates that the type B system can be dyed in a sufficiently high density using an acid or direct dye. In greater detail, Table 2 shows the water-washability of the unexposed areas in the lithographic photosensitive film according to the present invention after being dyed with different types of dyes (2), (3), and (4), while Table 3 shows the water-washability of exposed areas in the lithographic photosensitive film according to the present invention after being dyed with different types of dyes (2), (3) and (4).

The type A gelatins used in this invention are generally those having an isoelectric point of at least 7. Generally available type A gelatins have a PI in the range of 7 to 9, and these gelatins all give good photographic characteristics. The available gelatins have a molecular weight of 65,000 to 90,000 but within this range the photographic characteristics are not particularly affected by the molecular weight.

In the present specification the terms "acid method gelatin", and "type A gelatin" all have the same meaning, and the terms "alkali method gelatin", "alkali treated gelatin" and "type B gelatin" all have the same meaning, respectively. Reference should be made to the ENCYCLOPEDIA OF CHEMICAL TECHNOLOGY, Kirk-Othmer, Encyclopedia, Inc., New York, New York, Volume 7, Pages 145–153 (1951), where the difference between type A gelatin and type B gelatin is explained in detail.

As is known in the art, gelatin is commonly formed by swelling fibrous collagen particles in an acid or alkali, which swelling tends to weaken the linkages so that upon conversion to gelatin by hot water and steam a final linkage rupture takes place without complete disintegration. The nature of the raw-material processing before conversion to gelatin, as reported in the Encylopedia of Chemical Technology, is used to characterize gelatins into two types: type A gelatins which result from acid pretreatment (swelling of the raw-material in the presence of acid) and type B gelatins which result from alkali pretreatment (swelling of the raw material in the presence of alkali). Apparently the alkali pretreatment of collagenous raw-materials is accompanied by a removal of some non-gelatin-producing nitrogenous substances, whereby type B gelatins are rendered different from type A gelatins. The Encyclopedia of Chemical Technology further reports that in Europe and the United States type B gelatins are made from hide pieces and ossein with small quantities reported in the U.S. as being made from pork skins. On the other hand, Europe, without large quantities of pork skin, produces considerable quantities of type A gelatins from ossein by acid processes, generally considered inferior in quality to type A gelatins produced from pork skins.

The type A gelatins used in the present invention preferably have a pH of from about 4 to about 9, most preferably from 7 to 9. While gelatins having a pH outside this range can be used, generally as one strays further and further beyond the pH4 to 9 range gradually inferior results are encountered, with this tendency being more pronounced at lower pH's.

As is well known, commercially available type A gelatins in the delivered stage have a pH of 4-5 because of the manufacturing process thereof. Further work of the inventors showed that when the pH of a type A gelatin (PI≧7) is adjusted to a neutral or alkaline pH prior to use, easier washability of the unexposed areas can be achieved as compared with the use of commercially available type A gelatins having a pH on the acid side. This pH adjustment enables the exposed photographic material to be processed at lower temperatures within shorter periods of time.

The pH adjustment of commercially available acid method gelatins, as the type A gelatins are typically called, is carried out by adding a basic compound to an aqueous solution of the gelatin. The basic compounds which can be used in the present invention are water-soluble alkaline materials which show a pH value greater than 7 in aqueous solution, and include inorganic bases, salts of strong bases and weak acids and organic bases. Suitable examples of the inorganic bases are ammonia, alkali metal hydroxides, such as sodium hydroxide, alkaline earth metals hydroxides such as calcium hydroxide and the like. Suitable examples of the salts of strong bases and weak acids are sodium carbonate, sodium acetate and the like. Suitable examples of the organic bases are heterocyclic bases such as pyridine, pyridazine, N-methylmorpholine, piperidine, purine and the like and amines represented by the formula

wherein R may be the same or different groups and is a hudrogen atom, alkyl group, unsaturated alkyl group, cycloalkyl group, aralkyl group, hydroxyalkyl group, aminoalkyl group, or another substituted alkyl group, and of the three groups (or atoms) expressed by R, two may form a nitrogen-containing saturated hetero ring.

Examples of the amines included in the above formula are aliphatic primary amines containing from 1 to 3 carbon atoms such as methylamine, ethylamine, etc., aliphatic secondary amines containing 1 to 3 carbon atoms such as dimethylamine, etc., aliphatic tertiary amines having 1 to 3 carbon atoms such as trimethylamine, etc., hydroxyalkylamines having 1 to 3 carbon atoms such as monoethanolamine, diethanolamine, etc., cycloalkylamines such as n-cyclohexylamine, etc., aminoalkylamines such as ethylenediamine, hexamethylenediamine, hexamethylenetetramine, etc., unsaturated alkylamines such as allylamine, diallylamine, etc., water-soluble aromatic amines such as aniline, benzylaniline, dimethylaniline, etc.

It is very easy to adjust the pH of the acid treated gelatin using the alkaline compounds illustrated above. This can be accomplished by adding the alkaline compound directly or in the form of an aqueous solution to an aqueous solution of the gelatin.

The adjusted pH values should be within the range which does not adversely affect the stability of the diazonium salt/aldehyde co-condensate in the photosensitive composition, the coloration of non-image areas or the stability of the photoinsolubilized portion during water washing. The upper limit of the adjusted pH is about 9. In practice, the above conditions are all met within the range of $7 \geq pH \geq 9$, and as indicated this pH range is preferred in the present invention.

The following experimental results will illustrate the advantage of using acid method gelatin whose pH has to be readjusted to be neutral or in the alkaline area.

A 2.5% aqueous solution of a co-condensate formed between p-aminodiphenylamine diazonium salt and formaldehyde (See pages 188–189 or Organic Synthesis Collective, Volume 2) was mixed with a 10% aqueous solution of each of the gelatins having different isoelectric points and pH values as shown in Table 4 at a volume ratio of 1:4. The mixed solution was coated on a transparent biaxially stretched polyethylene terephthalate film (5 × 8 cm) in a dry film thickness of 3 microns. The resulting photographic material was image-wise exposed until the diazonium compounds completely decomposed, as evidenced by a disappearance of the characteristic yellow color of the diazonium compounds, and then immersed in a 2.5% aqueous solution of an acid dye, direct dye or mordanting dye, followed by washing with water. The following dyes were all utilized in this test.

Acid Dye — Brilliant Alizarin Light Blue 3FR (C.I. 62045), Naphthol Yellow S (C.I. 10316)

Direct Dye — Direct Green B (C.I. 30295), Benzo Deep Black E (C.I. 30235), Direct Fast Black (C.I. 27700)

Mordanting Dye — Solochrome Black 6 BN (C.I. 14640), Eriochrome Gray SGL (C.I. 18160).

In this experiment, two different types of acid-treated gelatins (PI 9, pH 5.0 and PI 7.8, pH 4.5) were used after their pH values were adjusted to those shown in Table 4 with hydroxyacetic acid or monoethanolamine. The exposure and dyeing of all photographic materials prepared as above were conducted under the same conditions, and the water-washing was carried out using tap water having a temperature of 18° C. for 30 seconds.

In more detail, exposure was carried out at a distances of 100 cm from the sample for 30 seconds using a 400W high pressure mercury lamp.

The exposed sampled was immersed in the dye solution at 30° C. for 3 min. or at 40° C. for 60 seconds or at 60° C. for 10 seconds.

The results obtained are shown in Table 4 below.

Table 4

| Gelatin | | Aqueous solutions of dyes temperature/immersion time | | | | | |
|---|---|---|---|---|---|---|---|
| | | 30° C./180 sec. | | 40° C./60 sec. | | 60° C./10 sec. | |
| PI | PH* | D | W | D | W | D | W |
| 9.0 | 3.1 | — — | — | — — | — — | ± | — |
| 9.0 | 5.0 | — | — | + | ± | +++ | ++ |
| 9.0 | 7.5 | ++ | ++ | ++ | +++ | +++ | +++ |
| 7.8 | 4.5 | + | — | ++ | ± | ++ | ++ |
| 7.8 | 8.6 | + | + | ++ | + | ++ | ++ |

*Measured at 35° C.; D and W respectively represent the density at exposed areas and the removability of the unexposed area.

In Table 4, a plus symbol indicates that the photographic material tested was found to be good in overall photographic properties and a minus symbol indicates that the photographic material was found to be poor in overall photographic properties. The relative superiority or inferiority are indicated by the number of plus or minus symbols.

When the sample of gelatin having a PI of 9.0 and pH of 5.0 exposed as described above was immersed for 3 minutes in an aqueous solution of dye (Benzo Deep Black E) at 30° C. and then washed with water at 18° C. for 30 seconds, the exposed area was black with a density of 3.5, but the unexposed area was light brown with a density of 0.40. However, when the sample using gelatin with a PI of 9.0 and pH of 3.1 was processed under the same conditions as above, the optical density of exposed areas was only 0.53, and that of unexposed areas was 0.02.

Tables 5 and 6 show the relationship between the dyeing time and the density of the exposed areas using Direct Fast Black D and acid-method gelatin as described in Table 5. The pH was adjusted using monoethanolamine and the exposed samples (exposure being under identical conditions) were immersed at 20° C. in a 2.5% aqueous solution of Direct Fast Black D.

As a result, the optical densities described in Table 5 were obtained. In the case of Table 5, the photoinsolubilized sample was immersed for a certain time in an aqueous dye solution kept at 30° C. and then sprayed with tap water (18° C.) for 30 seconds, followed by air drying. The color density was then measured.

Table 5

| Gelatin | | Aqueous dye solution (at 30° C.) | | | Immersion time (sec.) | |
|---|---|---|---|---|---|---|
| PI | pH | 10 sec. density | 30 sec. density | 60 sec. density | 90 sec. density | 120 sec. density |
| 9.0 | 7.8 | 0.9 | 1.8 | 2.5 | 2.8 | 3.2 |
| 9.0 | 4.1 | 0.45 | 0.9 | 1.6 | 2.2 | 2.6 |

The density of the sample was measured using a Mac-Beth Quanta-Log TD 205 type densitometer with a green filter [Wratten Filter No. 93 (produced by Eastman Kodak)].

It is seen from the above table that with gelatin having a pH of 4.1, the density of the exposed area increases substantially in a straight line fashion, whereas with gelatin having a pH of 7.8 the density increases as a fractional function rapidly approximating 3.5–3.8, and attains almost a constant value after immersion for about 2 minutes. Gelatin having a pH of 4.1, when immersed for about 5 minutes under the same conditions, attained a density of 3.5.

The time required for reaching the maximum dyeing (saturation in dyeing) varies depending upon the temperature of the aqueous dye solution used. If the temperature of the dye solution is maintained at a temperature greater than 50° C., the dyeing reaches its maximum within a period of time shorter than does the dyeing at a temperature below 50° C.

Examples thereof are shown in Table 6 below.

A mixed solution of 50 ml of a 10% gelatin aqueous solution (type A gelatin) with 10 ml of a 2.5% aqueous solution of a condensation product of p-diazodiphenylamine and formaldehyde was applied to a transparent biaxially stretched polyethylene terephalate film 75 microns thick using a conventional method to prepare a photosensitive film having a dried film thickness of 2 microns.

Exposure was carried out for 30 seconds at a distance of 100 cm from the samle using a 400 W high pressure mercury lamp.

The above conditions are the same as for the samples of Table 4. The exposed samples were immersed in a 2.5% aqueous solution of Direct Fast Black D., washed for 30 seconds using a tap water of 18° C. and then dried in air.

The optical densities in Table 6 were measured by the same method as in Table 5.

Table 6

| Gelatin | | Aqueous dye solution (at 50° C) | | | Immersion time (sec.) | |
|---|---|---|---|---|---|---|
| PI | pH | 10 (sec.) density | 30 (sec.) density | 60 (sec.) density | 90 (sec.) density | 120 (sec.) density |
| 8.3 | 5.04 | 1.10 | 1.75 | 2.51 | 2.90 | 4.18 |
| 8.3 | 7.60 | 1.27 | 2.65 | 2.96 | 3.32 | 4.23 |

A resolving power test chart was intimately adhered to the same samples, as shown in Tables 5 and 6 and after exposure, the samples were immersed for 1 minute in an aqueous solution of Direct Gast Black D kept at 40° C. The sample was withdrawn and sprayed for 30 seconds with tap water, followed by air drying. The results of the test are shown in Table 7. The pH was adjusted, where necessary, by adding acid-processed gelatin in place of monoethanol amine.

All conditions, unless otherwise indicated, were the same as used to obtain the data in Table 4. The thickness of the photosensitive film of the sample tested was 4 microns.

Table 7

| Gelatin | | Resolving power |
|---|---|---|
| PI | pH | (number/mm) |
| 9.0 | 7.8 | ~300 |
| 9.0 | 7.0 | 300–250 |
| 9.0 | 4.1 | ~200 |

It is clear from the above experimental results that by using acid-method gelatins having a pH of at least 7 photographic materials having higher resolving power can be obtained. The commercial value of these photographic materials is enhanced in that the post-treatment of the materials, that is, immersion in an aqueous dye solution and washing with water, can be performed at relatively low temperatures within short periods of time.

It is said that these condensates are photodegraded by irradation with actinic light, and each of the diazonium groups releases nitrogen to form a radical which will result in a crosslinking between the gelatin molecules and thus insolubilize the gelatin.

The diazonium insolubilizing agents which can be used in the present invention should be water-soluble and stable for a long period of time. They also must insolubilize gelatin upon irradation with actinic light. Diazonium insolubilizing agents which satisfy the above requirements include a condensation product of a diazonium salt of para-aminodiphenylamine or a derivative thereof and an aldehyde. Representative of the para-aminodiphenylamine derivatives used herein are those having an alkyl group containing 1 to 4 carbon atoms, an alkoxy group containing 1 to 4 carbon atom, and a halogen atom wuch as chlorine and bromine as substituents on one or both phenyl nuclei of the diphenylamine moiety. The above substituents may be located on any available positions of the diphenyl moiety. Specific examples of the para-aminodiphenylamine derivatives are 3-methyldiphenylamine, 3-methoxydiphenylamine, 3,3'-dimethyldiphenylamine, 3,5-diethoxydipheylamine, 3-chlorodiphenylamine and the like. The aldehydes which can be used to form the condensation product with the above diazonium salt of para-aminodiphenylamine or a derivative thereof are aliphatic aldehydes, for example, formaldehyde, glyoxal, glutaraldehyde and the like.

The molar ratio of such condensate can be from 1:0.5 to 1:5 (diazonium salt:aldehyde).

The condensation products of the present invention are in the form of a solid usually powdery, and so long as this criterion is met, all such co-condensates can be used. The theroetical molecular weight of the solid co-condensates can be calculated as from about 400 to about 2100, and this serves as a general guideline. It should be understood, of course, that as long as the co-condensation products are solid at room temperature they can be used with success in the present invention.

The preferred ratio of type A gelatin to the co-condensate is 20:1 to 60:1 by weight.

The relationship between this mixing ratio and the photographic characteristics has been examined as follows: A step tablet as an original was placed on the photographic films prepared from various mixtures in the mixing ratios shown in Table 8 and a support in intimate contact therewith and exposed using a 400 W high intensity mercury lamp as a light source (100 cm from sample to light source). The exposed film was immersed for 20 seconds in a 5% solution of Direct Black EX (C.I. 30235) held at 40° C., washed with flowing tap water at 18° C. for 5 seconds and dried. The visual density of the film was measured by a densitometer equipped with a green filter (Wratten No. 93). The results are shown in Table 8.

Table 8

| Mixing ratio of type A gelatin* and condensate of p-diazophenylamine-formaldehyde | Exposure time (seconds) | Maximum density | Gamma |
|---|---|---|---|
| 20 : 1 | 60 | above 4.0 | about 9.50 |
| 35 : 1 | 90 | 3.90 | 8.73 |
| 40 : 1 | 120 | 3.60 | 6.45 |
| 60.1 | 180 | 3.35 | 5.20 |

*PI = 8.5, pH = 4.5

The photographic material of the present invention can be obtained by coating a transparent base film with a photographic solution composed of commercially available type A gelatin (if desired, its pH adjusted to 7-9) and a diazonium condensate. In order to prevent gelation, the photographic solution is desirably maintained at a temperature above the gelation temperature during the coating operation. If the thickness of the coated film increases, the maximum dye density increases, but the sensitivity decreases and the resolving power becomes poor. In order to obtain a density of at least 3.0 and a resolving power of at least 100/mm, which are required of ordinary lithographic photographic materials, the thickness of the coating in the dry state is preferably from 0.5 micron to 12 microns, and especially when a resolving power of more than 200/mm is desired, the thickness of the coated film is preferably from 0.5 micron to 3 microns.

A substratum layer may be provided on the base film in order to improve the adhesion of the photosensitive layer according to this invention. However, those substratum layers which lead to an optical density of above 0.05 when a film including such a substratum layer is immersed for 3 minutes in a 1% aqueous solution of an acid or direct dye such as Direct Black EX held at 30° C. and then washed with water cannot be used in this invention. With respect to the present invention, almost all of the known substratum layers are not dyed with these dyes, but if phenol or trichloroacetic acid is made present during the formation of a substratum layer containing a polymeric electrolyte to render it strongly acidic, such a layer becomes unsusceptible to dyeing. Further, when a photodegradable diazonium compound used for diazo-type photography, such as p-morpholinobenzene diazonium or p-N,N-dimethyl aminobenzene diazonium, is incorporated into the substratum layer, it becomes an anti-halation layer and is effective for increasing the resolving power of the resulting photographic material. Such a material is decomposed by indoor light after processing and becomes colorless.

For exposure, a mercury lamp, Xenon lamp or chemical fluorescent lamp containing a high proportion of near ultraviolet rays at about 390 nm, the actinic light for the condensed diazonium compounds as a photoinsolubilizer, is employed as the light source. For example, the material is exposed through an original for 5 seconds to 2 minutes using a 400 W mercury lamp placed at a distance of 60 cm from the material.

The exposed material is then immersed in a 0.5-5% aqueous solution of the acid or direct dye to dye it sufficiently and washed with flowing tap water. If the concentration of the dye is within this range, the dye density is determined by a certain saturated dye adsorption which is substantially proportional to the thickness of the coated film formed on the base material. If the dye solution is heated, saturation dyeing is reached within a short time, and if its temperature is low, dyeing proceeds gradually and finally reaches saturation. The time required for dyeing varies according to the type and temperature of the dye.

Both the acid and direct dyes used are water-soluble and liberate anions in aqueous solution. Typical examples of the acid dyes are Brilliant Alizarin Light Blue 3FR (C.I. 62045), Naphthol Yellow S (C.I. 10316) and the like. Typical examples of the direct dyes are Direct Green B (C.I. 30295), Benzo Deep Black E (C.I. 30235), Direct Fast Black D (C.I. 27700) and the like. These examples are merely illustrative, however, and it is to be understood that the present invention finds application with known acid and direct dyes in general.

The melting point of gelatin increases considerably upon photoinsolubilization or dyeing. However, dyeing at higher temperatures causes the sol conversion of insolubilized gelatin, and deteriorates the sharpness of the resulting image. Accordingly, dyeing at above 80° C. is not desirable. Generally speaking, dyeing is usually at a temperature of from about 10° C. to 80° C. After the dyeing step, the material is squeezed free of water and dried, thereby to give a sharp image of high contrast and high density which is free from background coloration.

The following Examples will illustrate the present invention in greater detail. In the present specification and the examples which follow, all percentages are given by weight unless otherwise indicated.

Unless otherwise indicated the condensation product between a salt of p-dizodiphenylamine and an aldehyde was produced in accordance with the basic procedures described in Example 1 of U.S. Pat. No. 2,679,498 Seven et al. Since Example 1 of this patent deals only with a condensation product between p-diazodiphenylamine (sulfate) and paraformaldehyde, the only modification of substance to the process is to change the starting materials, where required.

In greater detail, unless otherwise indicated the following procedure was used to form the condensation products used in the present invention.

Sulfuric acid (750 cc., 98%) was placed in a vessel with a stirrer and surrounded by an ice-salt bath. The acid was stirred and cooled and then 450 g. (1.535 moles) of p-diazonium diphenylamine sulfate were added, following which the reaction mixture was brought to a temperature of 6° C. A total of 60g. (2.000 moles) paraformaldehyde were then added at such a rate that the temperature did not exceed 10° C., some three hours being required. After addition of the aldehyde was complete the reaction was allowed to continue for thirty minutes after which 6 liters of isopropanal were added, stirring being continued. The alcoholic liquor was separated by decantation from the precipitated taffy-like solid, the latter then being triturated with some 6 liters additional isopropanal during which operation the original taffy-like solid changed to a greenish yellow powder which was separated.

EXAMPLE 1

Fifty (50) milliliters of a 10% aqueous solution of type A gelatin (#200, pH 4.5, product of Nitta Gelatin Company) having an isoelectric point of 7.8 and a jelly strength of 207 bloom and as a photoinsolubilizer, 10 ml. of a 2.5% aqueous solution of a co-condensation product between p-diazodiphenylamine and formaldehyde were stirred and heated to 40° C.

The resulting solution was coated on a 75-micron thick transparent biaxially stretched polyethylene terephthalate film support. The film was then placed in an oven at 80° C., and dried for 2 minutes to form a coated layer having a thickness of 2 microns.

The resulting element was then exposed for 3 minutes through a step tablet (Kodak Photographic Step Tablet No. 3; 21 steps; density range, approximately 0.5 to 3.05, hereinafter the same, product of Kodak Company) as an original using a 1 KW mercury lamp (H1000A type, product of Matsushita Denko Kabushiki Kaisha) as a light source which was placed at a distance of 65 cm from the material.

The exposed film was then immersed for 1 minute in a 3% aqueous solution of Kayarus Black G con. (C.I. 35255) (product of Nippon Kayaku Kabushiki Kaisha) at 40° C., removed and washed with flowing tap water for 5 seconds to thereby removed the dyed photosensitive layer corresponding to the unexposed areas.

The density of each stage of the resulting black image which was a negative with respect to the original was measured by a diffuse transmission densitometer (measurable density range 0–4.0; Macbeth Quanta-Log TD-204type) using a green filter (Kodak Wratten #93) and gamma values were obtained. The results were: a gamma of about 9.5, a maximum density of the image above 4.0; a background density of 0.01.

When type B gelatin was used instead of type A gelatin, a photographic material for lithographic purposes could not be obtained; portions to be removed were not dissolved out, dyeing was insufficient to provide low gamma values or the surface portion could not be dissolved and removed.

EXAMPLE 2

Fifty (50) milliliters of a 10% aqueous solution of type A gelatin (#230, pH 4.8, product of Nitta Gelatin Company) having an isoelectric point of 7.6 to 9.0 and a jelly strength of 235 bloom and, as a photoinsolubilizer, 4 ml. of a 2.5% aqueous solution of a condensation product of p-diazodiphenylamine and formaldehyde were stirred and heated to 50° C. The resulting mixed solution was coated on a 125 micron thick transparent biaxially stretched polyethylene terephthalate film support.

The film was placed in an oven at 60° C. and dried for 3 minutes to form a 2-micron thick coated layer.

A resolving power test chart (The United States National Bureau of Standards Microcopy Resolution Test Chart 1010; see also Microfilm Technology, Engineering and Related Fields, Carl E. Nelson, McGraw-Hill Book Company, Copywrited 1965, at Page 269.) was placed as an original on the coated film in intimate contact therewith, and the film was exposed for 30 seconds using a high pressure mercury lamp (450 W) having a maximumum spectrum of 36.5 nm (type UM 452, Usio Denki Kabushiki Kaisha) as a light source which was placed at a distance of 40 cm from the film.

The exposed film was immersed for 30 seconds in a 5% aqueous solution of Kayanol Milling Black VLG (C.I. 27070) at 35° C., and then washed with flowing tap water for 10 seconds to thereby remove the dyed photosensitive layer corresponding to the unexposed areas. The resulting black image was dried and observed by a microscope (400 X) to determines its resolving power. It was found that the resolving power was 200/mm. The density of the image at this time was 3.5, and was 0.02.

EXAMPLE 3

The same gelatin solution (50 ml.) and photoinsolubilizer (5 ml.) as in Example 1 were stirred and heated at 45° C. The resulting mixed solution was coated on a 125-micron thick transparent biaxially stretched polyethylene terephthalate film support, and dried in a constant temperature tank at 50° C. for 3 minutes to form a 3-micron thick coated layer.

The film was exposed for 30 seconds through a halftone dot scale (A-64094, available from Bychrome Co., Inc., U.S.A.) placed thereon as an original in an intimate contact therewith using a 400 W high pressure mercury lamp having an arc luminance 200 cd/cm$^2$ and a maximum spectrum of 365 nm (H400P type, Toshiba) which was placed at a distance of 45 cm from the film.

The exposed film was immersed for 3 seconds in a 4% aqueous solution of Japanol Fast Black D conc. (C.I. 27700, product of Sumitomo Chemical Co., Ltd.) at 50° C., and washed with flowing tap water for 3 seconds.

The resulting black image and a comparative sample prepared by exposing a commercially available silver salt lithographic film using the same halftone dot scale as above were observed by a microscope (400×). It was found that the halftone dots of the former were sharp, but those of the latter were not sharp and streaks had occurred as a result of the agitation of the developer solution.

EXAMPLE 4

The same gelatin solution (50 ml.) and photoinsolubilizer (8 ml.) as in Example 2 were stirred and heated to 40° C. The mixed solution was coated on a 75-micron thick transparent polyethylene terephthalate film on which a non-dyeable substratum layer consisting of the following formation had been formed (amount of coating 5 g/m$^2$).

| | |
|---|---|
| Saran Resin EX 5701 (Asahi Dow, a copolymer of vinyl chloride and vinylidene chloride) | 1.5 parts by weight |
| Trichloroacetic acid | 1.5 |
| Xylene | 30 |
| Methyl cellosolve acetate | 20 |
| Methyl ethyl ketone | 20 |
| p-N, N-diethylaminobenzene diazonium borofluoride | 0.5 |

The film was dried for 2 minutes in an oven at 80° C. and exposed for 20 seconds through a step tablet (Kodak Company) placed thereon in intimate contact therewith as an original using a carbon arc lamp (30 amperes) as a light source which was placed at a distance 40 cm from the film.

The exposed film was immersed for 5 seconds in a 2.5% aqueous solution of Nippon Deep Black RL Extra conc. (C.I. 30245, Sumitomo Chemical Co., Ltd.) at 40° C. and washed with flowing tap water for 7 seconds.

The gamma and maximum density of the exposed film were measured. It was found that the gamma was 6.5, the maximum density 3.7, and the background density was 0.01.

The film was printed on a commercially available presensitized printing plate, and printing was performed on proof prints of offset printing. The finish was good. The resolving power increased greatly as compared with a sample containing no substratum layer which was prepared at the same time.

The photographic material of the lithographic type so obtained has a high gamma, high density and low background density, and it is possible to thin the gelatin photosensitive layer without involving a reduction in density, whereby high resolution can be obtained. Furthermore, the work can be done in a bright room without the need for a darkroom, and because of the simplicity of the operation no skilled technique is required. Since the developer solution is a dye solution, it is not oxidized and can be used for long periods of time.

EXAMPLE 5

Monoethanolamine was added to a 10% aqueous solution of gelatin having an isoelectric point of 9.0, a pH of 4.1 (40° C.) and a jelly strength (as determined by gelometer) of 220 to adjust the pH of the gelatin to 7.3. Fifty (50) milliliters of this gelatin solution was uniformly mixed under a safe light with 4 ml. of a 2.5% aqueous solution of a co-condensation product formed between formaldehyde and p-diazodiphenylamine, and the mixture maintained at 45° C. The mixed solution was coated on a 125-micron thick transparent biaxially stretched polyethylene terephthalate film and dried at 60° C. to form a photosensitive film having a 2-micron thick coated layer.

The film was exposed for 30 seconds through a conventional lith-type original in intimate contact therewith using a 450 W superhigh pressure mercury lamp as a light source which was placed at a distance of 40 cm from the film. The exposed film was immersed for 10 seconds in a 3% aqueous solution of Benzo Deep Black E (direct dye available from Farbenfabriken Bayer A.G., Leverkusen, Germany, C.I. 30235) at 40° C., and sprayed with tap water for 10 seconds.

The black negative so obtained had a maximum density of 3.8, and a background density of 0.01.

EXAMPLE 6

N-Methylmorpholine was added to a 10% aqueous solution of gelatin having an isoelectric point of 8.3, a pH of 4.5 (40° C.) and a jelly strength of 267 (determined by gelometer) to adjust its pH to 7.0. The gelatin was uniformly mixed with 3 ml. of a 2.5% aqueous solution of a condensation product between p-diazodiphenylamine and formaldehyde and the mixture was maintained at 50° C. The mixed solution was then coated on a 75-micron thick transparent biaxially stretched polyethylene terephthalate film and dried in a dryer maintained at 80° C. to form a film having a photosensitive coating with a thickness of 2 microns.

The film was exposed for 3 minutes through a step tablet (#3, Kodak Company) in intimate contact therewith using a 1 KW mercury lamp as a light source which was placed at a distance of 65 cm from the film. The exposed film was immersed for 5 seconds in a 2.5% aqueous solution of Direct Fast Black D (direct dye available from Nippon Kayaku Kabushiki Kaisha, C.I. 27700) at 50° C. and then sprayed with water for 10 seconds to form a negative image.

The negative had a gamma value of about 8.0, a maximum density of 4.0 and a surface density of 0.02.

EXAMPLE 7

Diallylamine (C$_6$H$_{10}$NH) was added to the same gelatin solution as was used in Example 6 to adjust its pH to 8.0. Fifty milliliters of this gelatin aqueous solution was mixed with 5 ml. of a 2.5% aqueous solution of the photoinsolubilizing agent described in Example 1, and the mixture was maintained at 45° C. The mixed solution was coated a 125 microns thick biaxially stretched polyethylene terephthalate film and dried by air at 60° C. The support film had been coated with a liquid composition of the following formulation in an amount of 2 g/m$^2$ of the film to form a substratum layer.

| | | |
|---|---|---|
| Polyvinyl pyrrolidone | 1.5 | g |
| Glycolic acid | 4.5 | g |
| Dichloroethane | 50 | g |
| Isopropyl alcohol | 30 | g |
| p-N,N-dimethylaniline diazonium chloride ‡ ZnCl$_2$ | 2.0 | g |

The phtographic film obtained was exposed for 1 minute through a conventional lith type original in intimate contact therewith using a 1 KW mercury lamp as a light source placed at a distance of 45 cm from the film. The exposed film was processed in the same way as in Example 6 to form a lithographic photograph. This was used as an original and a commercially available negative presensitized printing plate was printed. It was subjected to offset printing in a customary manner to obtain very clear printed copies. The clearness was somewhat better than that of the printed copies obtained from a material containing no substratum layer, which was prepared at the same time.

As has been demonstrated by the foregoing Examples and as has been extensively discussed hereinbefore, the dye solution employed in the present invention may comprise an aqueous solution of either any acid dye or any direct dye, where no acid is added to the dye solution, as is generally done when dyeing with acid or direct dyes. As is further demonstrated by the Examples, the dye solution of the present invention nevertheless does dye the representative photographic material employed in the Examples whereby after the washing step, photorelief members suitable for lithographic purposes or the like are obtained.

While the invention has been described in detail and with reference to the specific embodiments thereof, it will be apparent to one skilled in the art that various changes and modifications can be made therein without departing from the spirit and scope thereof.

What is claimed is:

1. A method of making a photorelief member comprising the steps of
    exposing to an image of actinic radiation a member comprising a transparent synthetic resin film and a photoinsolubilizable layer formed thereon having a thickness from 0.5 micron to 12 microns, said layer comprising (a) type A gelatin having an isoelectric point of about 7 to 9 and a pH of from about 4 to about 9 and (b) a photosensitive, diazonium compound consisting of a condensation product of an unsubstituted p-aminodiphenylamine or a substituted p-aminophenylamine where the functional group is substituted directly to the phenyl nuclei, said functional group being selected from the group consisting of an alkyl group containing 1 to 4 carbon atoms, an alkoxy group containing 1 to 4 carbon atoms, a halogen and a combination thereof and an aldehyde where the ratio of said type A gelatin to said photosensitive, diazonium compound is 20:1 to 60:1, by weight, to thereby photoinsolubilize the exposed portions of the layer;
    subsequent to said exposing step, dyeing said layer with an aqueous solution of a dye selected from the group consisting of an acid dye and a direct dye so that both the exposed and unexposed portions of said layer are dyed; and
    subsequent to said dyeing step, washing the dyed layer with water to dissolve the unexposed portions of said layer to thereby form said photorelief member comprising the dyed photoinsolubilized layer portions disposed on said transparent synthetic resin film.

2. The method of claim 1 where said dye is an acid dye.

3. The method of claim 1 where said dye is a direct dye.

4. The method of claim 1 where said dyeing is effected at a temperature of about 10° C. to about 80° C.

5. The method of claim 4 where said aqueous solution of said dye contains 0.5 to 5 wt.% of dye.

6. The method of claim 1 where said exposing step is effected with light of near-ultraviolet at 390 nm.

7. The method of claim 1 where said layer thickness is from 0.5 micron to 3 microns.

8. The method of claim 1 where said pH is from 7 to 9.